(12) United States Patent
Lee et al.

(10) Patent No.: US 12,074,268 B2
(45) Date of Patent: Aug. 27, 2024

(54) TRANSPARENT LIGHT-EMITTING DEVICE DISPLAY

(71) Applicant: LG CHEM, LTD., Seoul (KR)

(72) Inventors: Kiseok Lee, Daejeon (KR); Kun Seok Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 320 days.

(21) Appl. No.: 17/437,372

(22) PCT Filed: Mar. 3, 2020

(86) PCT No.: PCT/KR2020/002980
§ 371 (c)(1),
(2) Date: Sep. 8, 2021

(87) PCT Pub. No.: WO2020/197112
PCT Pub. Date: Oct. 1, 2020

(65) Prior Publication Data
US 2022/0190221 A1  Jun. 16, 2022

(30) Foreign Application Priority Data
Mar. 27, 2019 (KR) ........................ 10-2019-0035155

(51) Int. Cl.
*H01L 33/62* (2010.01)
*H01L 33/38* (2010.01)
*H01L 33/44* (2010.01)
*H01L 33/48* (2010.01)

(52) U.S. Cl.
CPC .............. *H01L 33/62* (2013.01); *H01L 33/38* (2013.01); *H01L 33/44* (2013.01); *H01L 33/486* (2013.01)

(58) Field of Classification Search
CPC ......... H01L 33/62; H01L 33/38; H01L 33/36; H01L 33/44; H01L 33/40; H01L 33/56; H01L 33/52; H01L 33/58; C09J 133/00; C09J 175/04; C09J 183/04
See application file for complete search history.

(56) References Cited

U.S. PATENT DOCUMENTS

| 5,804,102 A | * | 9/1998 | Oi ............................. H01J 5/16 |
| | | | 315/111.21 |
| 5,813,753 A | * | 9/1998 | Vriens ...................... H04N 9/30 |
| | | | 257/97 |
| 7,382,422 B2 | | 6/2008 | Niiyama et al. |

(Continued)

FOREIGN PATENT DOCUMENTS

| CN | 101045550 B | 11/2012 |
| CN | 203276880 U | 11/2013 |

(Continued)

*Primary Examiner* — Mamadou L Diallo
(74) *Attorney, Agent, or Firm* — Bryan Cave Leighton Paisner LLP (57) ABSTRACT

A transparent light emitting device display comprising: a transparent substrate; a conductive metal pattern provided on the transparent substrate; a light emitting device provided on at least a part of the conductive metal pattern; a first transparent adhesive layer provided on the transparent substrate, the conductive metal pattern, and the light emitting device; a UV-cut film provided on the first transparent adhesive layer; and a second transparent adhesive layer provided on the UV-cut film.

11 Claims, 3 Drawing Sheets

(56) References Cited

U.S. PATENT DOCUMENTS

| | | |
|---|---|---|
| 10,575,400 B2 | 2/2020 | Maki |
| 10,734,365 B2 * | 8/2020 | Maki .................. H01L 23/5387 |
| 11,495,146 B2 | 11/2022 | Niibori |
| 2003/0064235 A1 * | 4/2003 | Okawa .................... G02B 1/04 |
| | | 528/170 |
| 2004/0245541 A1 | 12/2004 | Shitagaki et al. |
| 2005/0040763 A1 | 2/2005 | Yoon et al. |
| 2009/0168410 A1 | 7/2009 | Tanamura et al. |
| 2013/0092970 A1 * | 4/2013 | Sugizaki ............ H01L 33/0095 |
| | | 257/99 |
| 2014/0042398 A1 * | 2/2014 | Choi .................... G06F 3/0445 |
| | | 438/34 |
| 2014/0055718 A1 | 2/2014 | Li |
| 2014/0078572 A1 * | 3/2014 | Kato ....................... C09B 23/04 |
| | | 106/419 |
| 2014/0293394 A1 * | 10/2014 | Kato ..................... C09B 55/003 |
| | | 359/290 |
| 2015/0370395 A1 * | 12/2015 | Hsu ....................... G06F 3/0412 |
| | | 345/174 |
| 2017/0222182 A1 * | 8/2017 | Mo ....................... H10K 50/841 |
| 2017/0324040 A1 | 11/2017 | Yamamoto et al. |
| 2017/0358713 A1 | 12/2017 | Hong et al. |
| 2018/0038578 A1 | 2/2018 | Son |
| 2018/0076344 A1 * | 3/2018 | Rehder ................. H01L 31/048 |
| 2018/0374834 A1 * | 12/2018 | Tada ....................... H01L 33/62 |
| 2019/0312182 A1 * | 10/2019 | Lim ....................... H01L 33/504 |
| 2020/0062906 A1 * | 2/2020 | Jeong ................ C08G 73/1039 |
| 2020/0144455 A1 * | 5/2020 | Son ........................ H01L 33/40 |
| 2020/0152715 A1 | 5/2020 | Hao et al. |
| 2020/0166802 A1 * | 5/2020 | Fukushima ......... H01L 25/0753 |
| 2022/0162486 A1 * | 5/2022 | Mori .................. C08G 18/7671 |
| 2023/0088640 A1 * | 3/2023 | Tham ..................... B01J 19/127 |
| 2023/0194775 A1 * | 6/2023 | Hnatovsky ............... G02B 5/18 |
| | | 385/37 |

FOREIGN PATENT DOCUMENTS

| | | | |
|---|---|---|---|
| JP | 2003-133058 A | | 5/2003 |
| JP | 2006058753 A | | 3/2006 |
| JP | 2007-142473 A | | 6/2007 |
| JP | 2008168478 A | * | 7/2008 |
| JP | 2009158691 A | * | 7/2009 |
| JP | 2011070090 A | * | 4/2011 |
| JP | 3203462 U | | 3/2016 |
| JP | 2017045855 A | | 3/2017 |
| JP | 2017120363 | | 7/2017 |
| JP | 2018185396 A | | 11/2018 |
| KR | 10-2004-0034298 A | | 4/2004 |
| KR | 10-2005-0019451 A | | 3/2005 |
| KR | 10-2014-0002224 A | | 1/2014 |
| KR | 10-2015-0033169 A | | 4/2015 |
| KR | 10-2016-0108646 A | | 9/2016 |
| KR | 10-2016-0134963 A | | 11/2016 |
| KR | 10-2017-0098153 A | | 8/2017 |
| KR | 10-1789145 B1 | | 10/2017 |
| KR | 10-2017-0139924 A | | 12/2017 |
| KR | 10-2018-0012680 A | | 2/2018 |
| TW | 201503442 A | * | 1/2015 |
| TW | 201621021 A | | 6/2016 |
| TW | 201900798 A | | 1/2019 |
| WO | 2004/060021 A1 | | 7/2004 |
| WO | 2016178322 A | | 11/2016 |

\* cited by examiner

TRANSPARENT LIGHT-EMITTING DEVICE DISPLAY

CROSS-REFERENCE TO RELATED APPLICATIONS

This application is a U.S. national stage of international application No. PCT/KR2020/002980, filed on Mar. 3, 2020, and claims priority to and the benefit of Korean Patent Application No. 10-2019-0035155 filed in the Korean Intellectual Property Office on Mar. 27, 2019, the entire contents of which are incorporated herein by reference.

FIELD

The present application relates to a transparent light emitting device display.

BACKGROUND

Recently, Korea has been providing information and attractions for urban people by creating luxurious signboards and a variety of landscape lighting in parks and city centers through a combination of advanced ICT technology and LED technology. In particular, transparent LED displays using ITO transparent electrode materials are those in which an LED is applied between glass and glass or a transparent film to which an LED is applied is attached to one surface of glass, and have an advantage in that it is possible to provide a luxurious look because an electric wire is not visible. For this reason, the transparent LED displays have been utilized for hotel interiors, department stores, and the like, and the importance thereof is increasing to achieve a media facade on an outer wall of a building.

For transparent electrodes used for touch screens and the like because the electrodes are transparent and electricity flows through the electrodes, the demand therefor has exploded as smart devices are popularized, and among the transparent electrodes, the most frequently used transparent electrode is indium tin oxide (ITO), which is an oxide of indium and tin. However, indium, which is a main raw material of an ITO transparent electrode material, has a small reserve worldwide and is produced only in some countries such as China, and the production cost thereof is high. Further, indium has a disadvantage in that the LED light to be displayed is not constant because the resistance value is not applied uniformly. For these reasons, the use of a transparent LED using ITO as a high-performance, low-cost transparent electrode material is limited.

Although it is true that ITO accounts for the largest proportion of transparent electrode materials and has been used as a transparent electrode material, research and technological development utilizing new materials have been continuously carried out due to limitations such as economic feasibility and limited performance Examples of transparent electrode materials that have attracted attention as next-generation new materials comprise metal mesh, nanowires (Ag nanowire), carbon nanotubes (CNT), conductive polymers, graphene, and the like. Among them, metal mesh is a new material that accounts for 85% of the materials that have replaced ITO and has high conductivity with a low cost, and the market is expanding in terms of its utilization.

Transparent LED displays utilizing metal mesh are easier to maintain than existing ITO transparent displays, and not only can the metal mesh greatly reduce resources and significantly improve environmental pollution prevention, but they are also economical due to reduction in manufacturing costs. Further, transparent LED displays utilizing metal mesh can be expanded and applied to various applications, and have the potential to be applied and utilized as a new transparent electrode material for various products.

SUMMARY

The present application has been made in an effort to provide a transparent light emitting device display.

An exemplary embodiment of the present application provides a transparent light emitting device display comprising: a transparent substrate; a conductive metal pattern provided on the transparent substrate; a light emitting device provided on at least a part of the conductive metal pattern; a first transparent adhesive layer provided on the transparent substrate, the conductive metal pattern, and the light emitting device; a UV-cut film provided on the first transparent adhesive layer; and a second transparent adhesive layer provided on the UV-cut film.

According to an exemplary embodiment of the present application, a transparent light emitting device display can comprise a UV-cut film, thereby preventing components constituting the transparent light emitting device display from deteriorating due to UV rays.

Further, according to an exemplary embodiment of the present application, a UV-cut film can be positioned on a first transparent adhesive layer, thereby planarizing a structure comprising the first transparent adhesive layer, and accordingly, it is possible to secure appearance characteristics of a transparent light emitting device display.

REFERENCE NUMERALS AND SYMBOLS USED HEREIN

10: Transparent substrate
20: Conductive metal pattern
30: Light emitting device
40: First transparent adhesive layer
50: UV-cut film
60: Second transparent adhesive layer
70: Bonding layer
80: Glass
90: Adhesive layer
100: Protective film
110: Flexible Printed Circuits Board (FPCB)

DETAILED DESCRIPTION

Hereinafter, the present application will be described in detail.

In the present application, "transparent" is intended to mean having a transmittance characteristic of about 80% or more in a visible light region (400 nm to 700 nm).

A transparent LED display is a product that is manufactured by mounting an LED device onto a transparent electrode substrate and devised to be easily attached to and detached from a glass window by laminating an adhesive layer on the top. In the process of laminating an adhesive layer on the top of an electrode film on which an LED device is mounted, the step difference between the LED device and the electrode film causes the flatness of the adhesive layer surface to decrease, thereby distorting the incident light and causing the functions of windows to deteriorate. To prevent this, a method of laminating a substrate in which a transparent and flat adhesive layer is provided on the top has been proposed.

By attaching a transparent LED display to a glass window that forms an exterior wall of a building to simultaneously perform the functions of a luxurious display and a transparent window, a new value can be imparted to the existing windows. As described above, when a transparent LED display is installed on the exterior wall of a building, the product is exposed to natural light for a long period of time, so that the product is required to have durability against ultraviolet rays.

Polyethylene naphthalate (PEN), which is a related art transparent LED film substrate, has a yellowing phenomenon in which the color turns yellow when exposed to ultraviolet rays for a long period of time, and a lamination-type transparent LED film can also have a problem in that an epoxy-based bonding layer is yellowed by ultraviolet rays. The more the yellowing progresses, the lower the transmittance of the product becomes, and this phenomenon needs to be alleviated because the appearance of the product is not good.

The present application is intended to prevent a yellowing phenomenon that occurs as materials constituting a transparent LED film are exposed to ultraviolet rays for a long period of time.

A transparent light emitting device display according to an exemplary embodiment of the present application comprises: a transparent substrate; a conductive metal pattern provided on the transparent substrate; a light emitting device provided on at least a part of the conductive metal pattern; a first transparent adhesive layer provided on the transparent substrate, the conductive metal pattern, and the light emitting device; a UV-cut film provided on the first transparent adhesive layer; and a second transparent adhesive layer provided on the UV-cut film.

In an exemplary embodiment of the present application, the UV-cut film can have a transmittance of 85% or more in a visible light region (380 nm≤λ≤780 nm), and a transmittance of less than 1% in a UV (λ<380 nm) region.

In an exemplary embodiment of the present application, the UV-cut film can be a transparent film comprising a UV absorber. In another exemplary embodiment of the present application, the UV-cut film can comprise: a transparent film; and a UV-cut coating layer provided on the transparent film.

The transparent film can be composed of: a urethane resin; a polyimide resin; a polyester resin; a (meth)acrylate-based polymer resin; a polyolefin-based resin such as polyethylene or polypropylene, and the like. In addition, the transparent substrate can be a film having a visible light transmittance of 80% or more, such as polyethylene terephthalate (PET), a cyclic olefin polymer (COP), polyethylene naphthalate (PEN), polyethersulfone (PES), polycarbonate (PC), polymethyl methacrylate (PMMA), and acetyl celluloid.

More specifically, a transparent film comprising the UV absorber can be prepared by using a material obtained by adding an ultraviolet absorber to the above-described transparent film material and performing an extrusion process and the like on the transparent film material.

Further, a UV-cut film can be prepared by coating a UV-cut coating composition on the transparent film.

The UV-cut coating composition can comprise a UV absorber, a photocurable resin, a photoinitiator, and an organic solvent.

It is preferred that the UV absorber has an extinction coefficient value of 0.01 to 0.10 at a wavelength of 380 nm. It is preferred that the UV absorber is a triazine-based UV absorber. The content of the UV absorber can be 0.1 part by weight to 5.0 parts by weight based on 100 parts by weight of the solid content of the coating liquid composition forming the coating layer of the UV-cut film.

When the content of the UV absorber is less than 0.1 part by weight based on 100 parts by weight of the solid content of the coating liquid composition forming the coating layer of the UV-cut film, there can occur a problem in that UV rays are not sufficiently blocked. In addition, when the content of the UV absorber is more than 5.0 parts by weight, a large amount of monomolecular UV absorbers are added to a binder, and as a result, the average molecular weight can be reduced, and the durability can deteriorate. With regard to the compatibility of the resin and the UV absorber, when the UV absorber is comprised in a large amount, a migration problem, in which the UV absorber escapes during the high temperature drying process after coating, is further aggravated, so that there is a tendency to be disadvantageous for processability.

As the photocurable resin, an acrylic-based resin can be specifically used, and for example, a reactive acrylate oligomer, a polyfunctional acrylate monomer or a mixture thereof can be used. As an oligomer of the reactive acrylate, a urethane acrylate oligomer, an epoxy acrylate oligomer, a polyester acrylate, a polyether acrylate, or a mixture thereof can be used. As the polyfunctional acrylate monomer, it is possible to use dipentaerythritol hexaacrylate, dipentaerythritol hydroxy pentaacrylate, pentaerythritol tetraacrylate, pentaerythritol triacrylate, trimethylene propyl triacrylate, propoxylated glycerol triacrylate, trimethylolpropane ethoxy triacrylate, 1,6-hexandiol diacrylate, propoxylated glycerol triacrylate, tripropylene glycol diacrylate, ethylene glycol diacrylate, or a mixture thereof.

In consideration of imparting an appropriate viscosity for easy workability during the application of the UV-cut coating composition, a film strength of a film to be finally formed, and the like, the organic solvent can be used in preferable amount of 50 parts by weight to 500 parts by weight, more preferably 100 parts by weight to 400 parts by weight, and most preferably 150 parts by weight to 350 parts by weight based on 100 parts by weight of the photocurable resin. In this case, as the type of organic solvent that can be used, it is possible to use one or a mixture of one or more selected from the group consisting of, for example, alcohols, acetates, ketones, cellosolves, dimethylformamide, tetrahydrofuran, propylene glycol monomethyl ether, toluene, and xylene, but the organic solvent is not limited thereto. In this case, examples of the alcohols comprise methanol, ethanol, isopropyl alcohol, butyl alcohol, isobutyl alcohol, diacetone alcohol, and the like, but are not limited thereto. Further, as the acetates, methyl acetate, ethyl acetate, isopropyl acetate, butyl acetate, or cellosolve acetate can be used, and as the ketones, methyl ethyl ketone, methyl isobutyl ketone, acetyl acetone, or acetone can be used, but the acetates and the ketones are not limited thereto.

As the photoinitiator, those known in the art can be used.

The UV-cut coating composition can comprise one or more of a leveling agent, a wetting agent, and an antifoaming agent as an additive. Each of the additives can be comprised in an amount in a range of 0.01 part by weight to 10 parts by weight based on 100 parts of the photocurable resin. The leveling agent serves to make the surface of a coating film coated using a coating composition uniform. In addition, as the wetting agent serves to lower the surface energy of the coating composition, the wetting agent helps the coating composition to be uniformly applied when a transparent substrate layer is coated with the coating composition. The antifoaming agent can be added to remove air bubbles in the coating composition. The solid content of the coating liquid composition forming the coating layer means a component excluding the solvent.

It is preferred that the UV-cut coating layer has a thickness of 3 μm to 10 μm.

Further, it is preferred that the UV-cut film has a thickness of 50 μm to 250 μm. When the UV-cut film has a thickness of less than 50 μm, the workability is not good, and it can be difficult to control the flatness of the adhesive layer by film lamination. In addition, when the UV-cut film has a thickness of more than 250 μm, physical properties of the optical material, such as transmittance and haze can deteriorate, which increases the manufacturing cost and is disadvantageous for reducing the weight of a product.

In an exemplary embodiment of the present application, a bonding layer can be further comprised between the transparent substrate and the conductive metal pattern. That is, a bonding layer can be provided on the transparent substrate, and a conductive metal pattern can be provided on the bonding layer.

Further, in another exemplary embodiment of the present application, a bonding layer can be further comprised on the transparent substrate, and the conductive metal pattern can be embedded in the bonding layer. In this case, at least a part of the conductive metal pattern embedded in the bonding layer can be provided so as to be brought into contact with the light emitting device.

The bonding layer can comprise a thermosetting bonding agent composition or a UV curable bonding agent composition, or a cured product thereof. More specifically, the bonding layer can comprise a silane-modified epoxy resin, a bisphenol A-type phenoxy resin, an initiator, and a silane coupling agent, but is not limited thereto. The bonding layer can have a thickness of 8 μm to 50 μm. When the bonding layer satisfies the above thickness range, a metal pattern corresponding to a wiring electrode part can be completely embedded in the bonding layer, and when the thickness of the bonding layer is out of the above thickness range, the wiring electrode part cannot be completely embedded, or the fluidity of the bonding layer can be increased to cause pattern disconnection. More specifically, when the thickness of the bonding layer is less than 2.5 times the thickness of the metal pattern, it is impossible to completely embed the metal pattern in the bonding layer, and thus the upper surface of the wiring electrode part is exposed, so that a deterioration in durability due to corrosion can be induced, and bubbles are trapped on the upper part of the adhesive layer between the wiring electrode parts, so that a defect in appearance can occur. In addition, when the thickness of the bonding layer is more than twice the thickness of the metal pattern, the fluidity of the bonding layer can increase during the embedding process by a thermal lamination process, so that disconnection of the wiring electrode part pattern can be caused.

In an exemplary embodiment of the present application, the conductive metal pattern can comprise a wiring electrode part pattern and a light emitting device mounting part pattern, and the light emitting device can be provided on the light emitting device mounting part pattern.

In the present application, the wiring electrode part pattern can comprise a first common electrode wiring part pattern, a second common electrode wiring part pattern, and a signal electrode wiring part pattern. The signal electrode wiring part pattern can be provided between the first common electrode wiring part and the second common electrode wiring part. In an exemplary embodiment of the present application, the first common electrode wiring part can be a (+) common electrode wiring part, and the second common electrode wiring part can be a (−) common electrode wiring part. Further, the first common electrode wiring part can be a (−) common electrode wiring part, and the second common electrode wiring part can be a (+) common electrode wiring part. According to an exemplary embodiment of the present application, a channel is formed in which the signal electrode wiring part passes between the (+) common electrode wiring part and the (−) common electrode wiring part, so that an electrode wiring is not separately provided for each light emitting device, and can be connected as a common electrode between the (+) common electrode wiring part and the (−) common electrode wiring part.

In the present application, the light emitting device mounting part pattern is configured to be provided at a position where the light emitting element is mounted using a solder.

In the present application, the number of the light emitting devices can be appropriately selected by those skilled in the art in consideration of the use of the transparent light emitting device display and the like, and is not particularly limited. More specifically, the number of the light emitting devices is related to the resistance of the electrodes, and the number of the light emitting devices can be increased as the electrodes have sufficiently low resistance and the area of the display is large. When the number of light emitting devices increases in the same area, the resolution increases, and when the number of light emitting devices increases at the same interval, the area of the display increases and the electric wire lines of the power supply unit can be decreased, so that the number of light emitting devices can be appropriately selected by those skilled in the art in consideration of the use of the transparent light emitting device display, and the like.

In an exemplary embodiment of the present application, the light emitting device can be connected in series with the signal electrode wiring part pattern and can be connected in series with the first common electrode wiring part pattern and the second common electrode wiring part pattern. Since the first common electrode wiring part pattern and the second common electrode wiring part pattern provide a sufficient amount of current for driving the light emitting device, and sending a color signal from the light emitting device requires only a low current, the first common electrode wiring part pattern and the second common electrode wiring part pattern can be connected in series with the signal electrode wiring part pattern.

If the light emitting devices are connected in parallel with the respective electrodes to the power supply unit instead of the structure as in the present application for driving and signals of all the light emitting devices, the width of each electrode needs to be different (the width of the electrode connected to the farthest light emitting device is the largest) to satisfy the resistance value depending on the arrangement distance of the light emitting device, and it is difficult to construct an electrode having a low resistance due to the spatial restriction of the electrode arrangement area caused by characteristics in which a plurality of light emitting devices is provided.

In an exemplary embodiment of the present application, the first common electrode wiring part pattern, the second common electrode wiring part pattern, and the signal electrode wiring part pattern can be separated from each other by a disconnection part. The disconnection part means a region where a part of the pattern is cut off to disconnect the electrical connection. The width of the disconnection part can mean the distance between the nearest ends among the first common electrode wiring part pattern, the second common electrode wiring part pattern, and the signal electrode wiring part pattern, which are separated from each other. The width of the disconnection part can be 80 μm or less, 60 μm or less, 40 μm or less, or 30 μm or less, but is not limited thereto. The width of the disconnection part can be 5 μm or more. According to an exemplary embodiment of the present application, the recognizability of wiring can be lowered by minimizing the width of the disconnection part that separates the first common electrode wiring part pattern, the second common electrode wiring part pattern, and the signal electrode wiring part pattern from each other.

In an exemplary embodiment of the present application, the line width of the light emitting device mounting part pattern can be 100 μm or more, and can be 100 μm to 1,000 μm, but is not limited thereto.

In an exemplary embodiment of the present application, the line width of the wiring electrode part pattern can be 50 μm or less, 30 μm or less, 25 μm or less, and 20 μm or less, but is not limited thereto. The smaller the line width of the wiring electrode part pattern, the more advantageous the wiring electrode part pattern in terms of transmittance and recognizability of the wiring, but may cause a decrease in resistance, and in this case, the decrease in resistance can be improved when the thickness of the wiring electrode part pattern is increased. The wiring electrode part pattern can have a line width of 5 μm or more.

The material of the conductive metal pattern is not particularly limited, but preferably comprises one or more of a metal and a metal alloy. The conductive metal pattern can comprise gold, silver, aluminum, copper, neodymium, molybdenum, nickel, or an alloy thereof, but is not limited thereto.

The thickness of the conductive metal pattern is not particularly limited, but can be 3 μm or more, and can be 3 μm to 20 μm from the viewpoint of the conductivity of the conductive metal pattern and the economic feasibility of the forming process.

In an exemplary embodiment of the present application, the first transparent adhesive layer and the second transparent adhesive layer can each independently comprise one or more of a silicone-based material, an acrylic-based material, a urethane-based material, and a derivative thereof.

More specifically, the first transparent adhesive layer can be formed of a composition for an adhesive layer comprising an adhesive resin such as a (meth)acrylic-based resin, a urethane resin, a silicone resin, and an epoxy resin; a curing agent; a photoinitiator; and a silane coupling agent, but the present invention is not limited thereto. For example, the (meth)acrylic-based resin can comprise a polyalkyl(meth) acrylate, and the polyalkyl(meth)acrylate can comprise one or more of polymethylacrylate, polyethylacrylate, polypropylacrylate, polybutylacrylate, polyisopropylacrylate, polyhexylacrylate, polyhexylmethacrylate, polyethylhexylacrylate, polyethylhexylmethacrylate, and polysiloxane, but is not limited thereto. As the urethane resin, a polyurethane resin can be used, and the polyurethane resin can comprise a urethane group as a non-(meth)acrylate-based resin having no (meth) acrylate group. The polyurethane resin can be a commercially available product, or can be synthesized by a typical method.

The second transparent adhesive layer can comprise a silicone-based resin and a curing agent. For example, the silicone-based resin can be a vinyl group-containing polydimethylsiloxane resin. More specifically, the vinyl group-containing polydimethylsiloxane resin can be prepared from a composition for preparing a silicone-based rubber comprising vinylmethyldimethoxysilane, which is a vinyl group-containing silicone monomer, and dimethyldimethoxysilane having no vinyl group. The composition for preparing a silicone-based rubber can further comprise other typical silicone monomers other than dimethyldimethoxysilane as a silicone monomer having no vinyl group. The curing agent can comprise a silicone-based compound having two or more Si—H groups to perform a hydrosilylation reaction with a curable functional group of a silicone-based rubber. The curing agent can perform a hydrosilylation reaction by heat and/or UV. The curing agent can be comprised in an amount of 0.1 part by weight to 20 parts by weight, specifically 0.5 part by weight to 18 parts by weight, and specifically, 0.7 part by weight to 15 parts by weight, based on 100 parts by weight of the silicone-based rubber. Within the above ranges, there can be an effect of a degree of curing that is capable of exhibiting an impact resistance effect.

The first transparent adhesive layer is formed to have a thickness which is 1.0 mm to 10.0 mm higher than the height step difference of the light emitting device, but is not limited to the thickness. When the thickness of the first transparent adhesive layer is more than the height difference of the light emitting device by less than 1.0 mm, the surface of the light emitting device mounted on the top of the electrode film cannot be sufficiently covered, and the light emitting device can be damaged upon external impact, and the adhesion properties of the UV-cut film laminated on the first transparent adhesive layer can deteriorate. Further, when the thickness of the first transparent adhesive layer is more than the height step difference of the light emitting element by 10.0 mm, unnecessary consumption of materials occurs, which can be disadvantageous for the weight reduction of the product.

A thickness of the second transparent adhesive layer can be 0.01 mm to 10.0 mm, but is not limited thereto. When the thickness of the second transparent adhesive layer is less than 0.01 mm, the leveling property of the liquid silicone resin forming the second transparent adhesive layer deteriorates, the uniformity of the thickness of the second transparent adhesive layer can be impaired, and there is a concern about durability against physical damage that can occur during the operation of repeatedly attaching and detaching the product, which is not preferred. In addition, when the thickness of the second transparent adhesive layer is more than 10.0 mm, unnecessary consumption of materials occurs, which can be disadvantageous for the weight reduction of the product.

In an exemplary embodiment of the present application, the transparent substrate can be a glass substrate or a transparent plastic substrate having excellent transparency, surface smoothness, ease of handling, and waterproof properties, but is not limited thereto as long as the transparent substrate is a transparent substrate typically used in an electronic device. Specifically, the transparent substrate can be composed of: glass; a urethane resin; a polyimide resin; a polyester resin; a (meth)acrylate-based polymer resin; a polyolefin-based resin such as polyethylene or polypropylene, and the like. Furthermore, the transparent substrate can be a film having a visible light transmittance of 80% or more, such as polyethylene terephthalate (PET), a cyclic olefin polymer (COP), polyethylene naphthalate (PEN), polyethersulfone (PES), polycarbonate (PC), and acetyl celluloid. A thickness of the transparent substrate can be 25 μm to 250 μm, but is not limited thereto.

Figure 1:
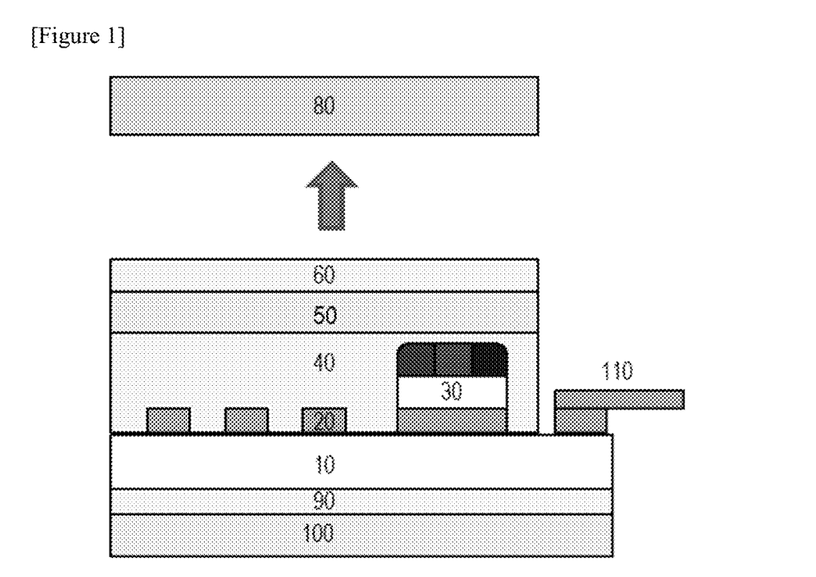
FIGS. 1 and 2 are schematic illustrations of a transparent light emitting device display according to exemplary embodiments of the present application.
Figure 2:
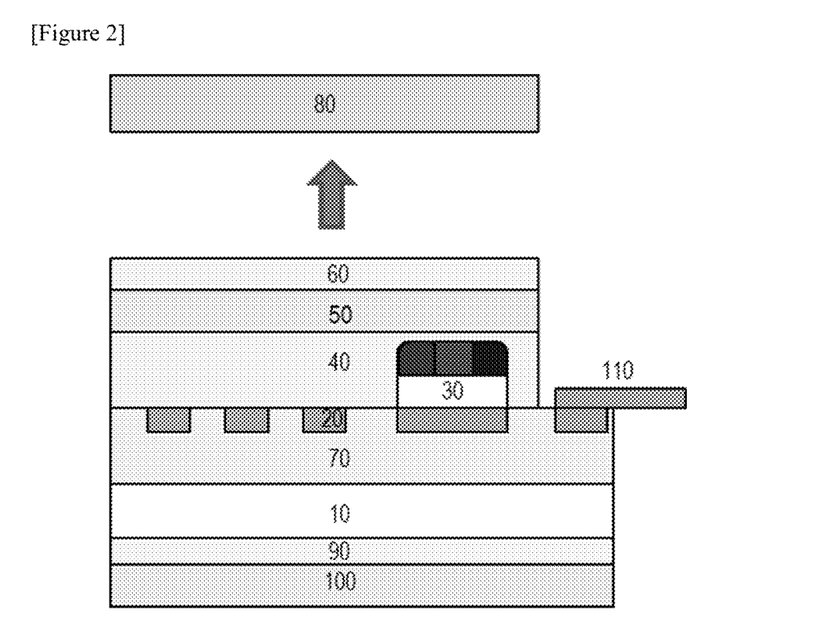
Figure 3:
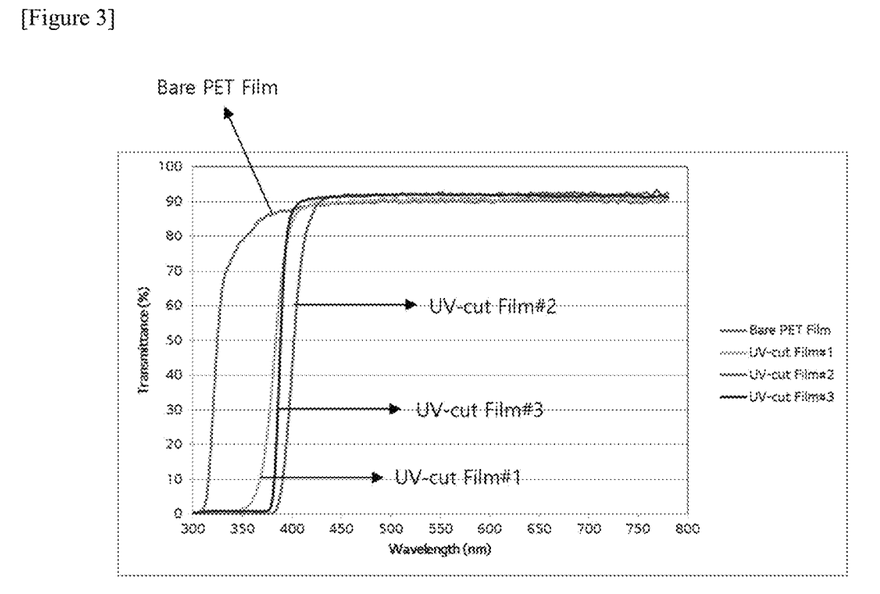
FIG. 3 is a graphical representation of the optical characteristics of UV-cut films and a general optical film according to the Examples and Comparative Examples of the present application.

The transparent light emitting device display according to an exemplary embodiment of the present application is schematically illustrated in the FIGS. 1 and 2. More specifically, FIG. 1 illustrates a transparent light emitting device display comprising a bonding layer between a transparent substrate and a conductive metal pattern, and FIG. 2 illustrates a transparent light emitting device display comprising a bonding layer on a transparent substrate, in which the conductive metal pattern is provided in a form of being embedded in the bonding layer.

Hereinafter, exemplary embodiments described in the present specification will be exemplified through Examples. However, the scope of the exemplary embodiments is not intended to be limited by the following Examples.

EXAMPLES

Example 1

The raw materials used in the present application were prepared by performing electrolytic plating on polyethylene terephthalate (PET, XG7PH2 manufactured by Toray Industries Inc.) to form a copper (Cu) layer, and a dry film resist (DFR, Asahi Chemical Industry SPG-152) was thermally laminated on the metal surface using a roll laminator at 100° C.

A photomask comprising a wiring electrode part pattern and a light emitting device mounting part pattern was applied to the upper surface of a Cu plating raw material where DFR was laminated, and exposed to UV at a wavelength of 365 nm wavelength with a light intensity of 250 mJ/cm² using a collimation light exposure device. Thereafter, a metal pattern having an unevenness structure was formed on the top of a bonding layer by a wet process of development-etching-peeling. All solutions used in each step were maintained at room temperature. A 1.0 wt % aqueous Na₂CO₃ was used as a developing solution, an etchant was a mixed solution comprising iron chloride and hydrochloric acid, and a 2.0 wt % aqueous NaOH solution was used as a stripping solution.

The Cu wiring electrode part pattern was a repetitive square mesh pattern, and had a line width of 24 μm, a pitch of 300 μm, a line height of 8 μm, and a disconnection part having a width of 60 μm, which were all the same.

After a solder paste was screen-printed on an electrode pad part, the light emitting device was mounted and introduced at a temperature of about 170° C., and the solder paste was used to bond the light emitting device mounting part and the light emitting device through a solder paste reflow process. A first adhesive layer composition was applied in an amount of 1 g or less per unit area of 1 cm² of the electrode film to form a first adhesive layer on the top of the light emitting device and the electrode film. After the adhesive layer was left to stand at room temperature for 10 minutes or more to achieve planarization of the adhesive layer by leveling, a UV-cut film was laminated on the adhesive layer using a laminator when the adhesive strength with respect to glass was 100 gf/inch or more. The UV-cut film was manufactured by coating an optical PET film (V5400 manufactured by SKC) having a thickness of 188 μm with a composition comprising 1.0 part by weight of a UV absorber and drying the optical PET film at 100° C. for 10 minutes. A composition for forming a second adhesive layer was applied to the top of the UV-cut film, and the UV-cut film was left to stand at room temperature for 48 hours.

The UV-cut film was left to stand at room temperature for 90 minutes by coating both surfaces of the film with DY-39-067 (Dow Chemical) to improve adhesion with a silicone adhesive, and compositions for a first adhesive layer and a second adhesive layer were prepared by adding 50 parts by weight of methyl ethyl ketone to 10 parts by weight of Sylgard 184B (Dow Chemical, solid content; 100 wt %) comprising a curing agent in 100 parts by weight of Sylgard 184A (Dow Chemical, solid content: 100 wt %) comprising a vinyl group-containing polydimethylsiloxane resin and stirring the resulting mixture.

Example 2

A process was performed in the same manner as in Example 1, except that a PMMA film coated with a composition comprising 2.0 parts by weight of a UV absorber was used as the UV-cut film laminated on the top of the first adhesive layer of Example 1.

Example 3

A process was performed in the same manner as in Example 1, except that a PET film coated with a composition comprising 2.0 parts by weight of a UV absorber was used as a UV-cut film laminated on the top of the first adhesive layer of Example 1.

Comparative Example 1

A process was performed in the same manner as in Example 1, except that an optical PET film (V5400 manufactured by SKC) having a thickness of 188 μm was laminated on top of the first adhesive layer in Example 1.

Example 4

A process was performed in the same manner as in Example 1, except a copper-foil laminated film was used as a raw material for the electrode film instead of the Cu-plated film of Example 1.

The copper-foil laminated film is generally a copper film having a structure which is the same as a structure well-known as a Cu clad laminate (CCL), and was prepared by forming a bonding layer on a transparent substrate, and then performing thermal lamination with copper foil. A coating solution for a bonding layer was prepared by introducing a silane-modified epoxy resin, a bisphenol A epoxy resin, and a phenoxy resin at a weight ratio of 35:33:30 and diluting the resulting mixture with methyl ethyl ketone (MEK). The prepared solution was subjected to comma coating on a PET film having a thickness of 100 μm and a high-temperature drying process at 130° C. for 3 minutes to form a bonding layer having a thickness of 25 μm. A copper-foil laminated film was prepared by subjecting a copper foil (LPF manufactured by ILJIN MATERIALS CO., LTD.) having a thickness of 8 μm and the bonding layer to roll lamination at a temperature of 100° C. A dry film resist was thermally laminated on the top of the copper foil of the manufactured copper-foil laminated film at a temperature of 100° C., and exposed to a UV light with a wavelength of 365 nm at a light intensity of 250 mJ/cm² using a negative-type photomask corresponding to the first metal foil pattern and the second metal foil pattern and a collimation light exposure device. A metal pattern having an unevenness structure was formed on the top of a bonding layer by a wet process of development-etching-peeling. All solutions used in each step were maintained at room temperature. A 1.0 wt % aqueous $Na_2CO_3$ solution was used as a developing solution, an etchant was a mixed solution comprising iron chloride and hydrochloric acid, and a stripping solution was a 2.0 wt % aqueous NaOH solution. To planarize the surface of the bonding layer and embed the metal pattern into the bonding layer, a metal pattern film and a release PET film (SLF050-060 manufactured by OPTIVER Korea) having a thickness of 50 μm were thermally laminated using a roll laminator at 100° C. UV curing was performed in a state where the release film was laminated, and the surface of the PET film was irradiated with a UV light with a wavelength of 365 nm at a light intensity of 5,000 mJ/cm².

Example 5

A process was performed in the same manner as in Example 4, except that a PMMA film coated with a composition comprising 2.0 parts by weight of the UV absorber of Example 4 was used as a UV-cut film laminated on the top of the first adhesive layer.

Example 6

A process was performed in the same manner as in Example 4, except that a PET film coated with a composition comprising 2.0 parts by weight of the UV absorber of Example 4 was used as a UV-cut film laminated on the top of the first adhesive layer.

Comparative Example 2

A process was performed in the same manner as in Example 4, except that an optical PET film (V5400 manufactured by SKC) having a thickness of 188 μm was laminated on top of the first adhesive layer in Example 4.

Experimental Example 1

Optical characteristics of the UV-cut films applied in Examples 1 to 6 and general optical PETs applied in Comparative Examples 1 and 2 were evaluated, and are shown in the Tables 1 and 3. The optical characteristics were measured using a Solid spec-3700 device.

TABLE 1

| Classification | Film Type | UV absorber Parts by weight | Transmittance | | b* | YI |
| --- | --- | --- | --- | --- | --- | --- |
| | | | UVA (365 nm) | Visible light (380 nm to 780 nm) | | |
| UV-cut Film#1 (Application in Examples 1 and 4) | PET | 1.0 | 7.2 | 90.5 | 0.62 | 1.20 |
| UV-cut Film#2 (Application in Examples 2 and 5) | PMMA | 2.0 | 0.0 | 90.8 | 1.00 | 1.59 |
| UV-cut Film#3 (Application in Examples 3 and 6) | PET | 2.0 | 0.8 | 91.7 | 0.40 | 0.72 |
| Bare PET Film (Application in Comparative Examples 1 and 2) | PET | 0.0 | 83.7 | 89.9 | 0.36 | 0.82 |

As a result of measuring the optical properties, it can be confirmed that the higher the weight part of the UV absorber in the UV-cut coating liquid composition, the lower the light transmittance in the UVA region becomes, and the b* and YI values are decreased regardless of the coating substrate.

Experimental Example 2

Figure 4:
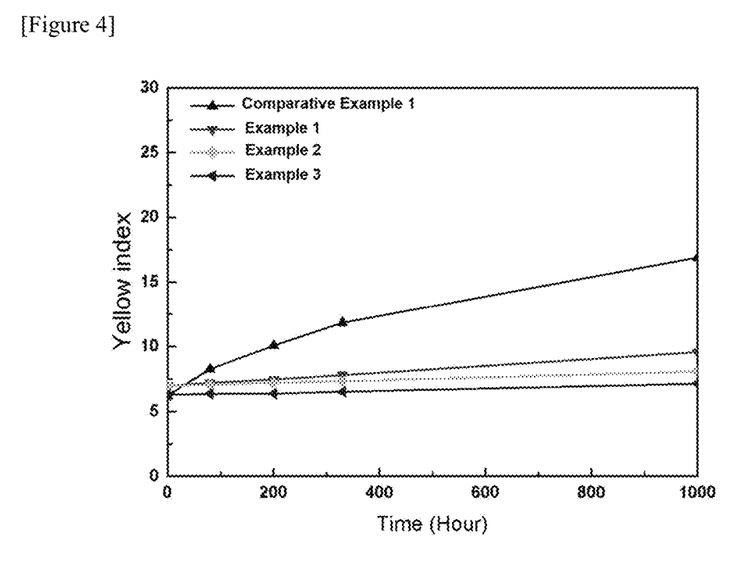
FIG. 4 is a graphical representation of the light resistance evaluation results of the transparent light emitting device displays according to Examples 1 to 3 and Comparative Example 1.
Figure 5:
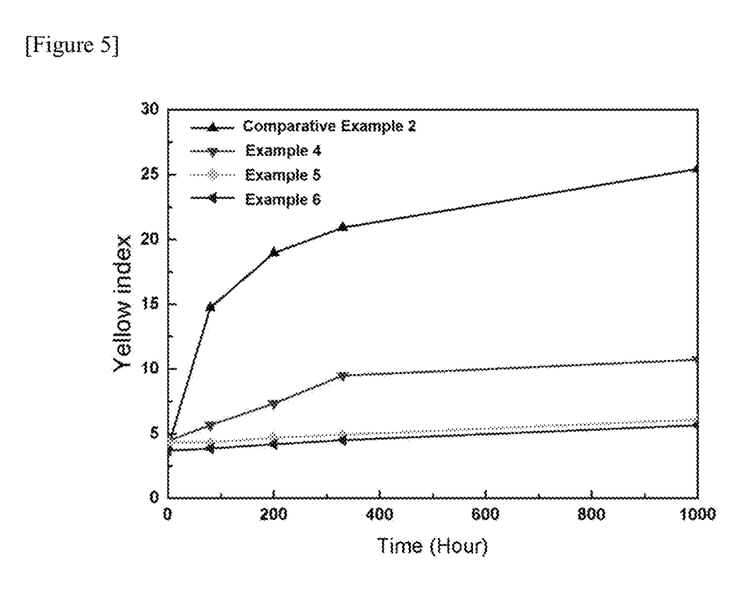
FIG. 5 is a graphical representation of the light resistance evaluation results of the transparent light emitting device displays according to Examples 4 to 6 and Comparative Example 2.

The changes in Yellow Indices of the transparent light emitting device displays prepared in Examples 1 to 6 and Comparative Examples 1 and 2 according to the light resistance evaluation time were evaluated, and the results are shown in Table 2 and FIGS. 4 and 5.

Light resistance evaluation device: QUV manufactured by Q-LAB Co., Ltd. (Light intensity: 750 mW/m$^2$)

Optical property measurement device: COH-400 (manufactured by Nippon Denshoku Industries Co., Ltd.)

TABLE 2

| Yellow Index | Light resistance evaluation (hour) | | | | |
|---|---|---|---|---|---|
| | 0 | 80 | 200 | 330 | 1,000 |
| Example 1 | 6.97 | 7.21 | 7.46 | 7.80 | 9.57 |
| Example 2 | 6.99 | 7.04 | 7.22 | 7.33 | 8.07 |
| Example 3 | 6.28 | 6.36 | 6.37 | 6.52 | 7.14 |
| Example 4 | 4.44 | 5.66 | 7.32 | 9.48 | 10.70 |
| Example 5 | 4.32 | 4.33 | 4.68 | 4.92 | 6.08 |
| Example 6 | 3.68 | 3.86 | 4.18 | 4.50 | 5.65 |
| Comparative Example 1 | 6.23 | 8.27 | 10.07 | 11.84 | 16.90 |
| Comparative Example 2 | 3.95 | 14.75 | 18.95 | 20.92 | 25.43 |

As shown by the results, it can be confirmed that the lower the light transmittance in the UVA region of the UV-cut film, the less yellowing of the product caused by UV exposure. In particular, since a bonding layer used in an embedded electrode film is severely yellowed by UV, the yellowing prevention effect is greater than that of a protrusion electrode film.

As shown by the results, according to an exemplary embodiment of the present application, a transparent light emitting device display can comprise a UV-cut film, thereby preventing components constituting the transparent light emitting device display from deteriorating due to UV rays. Further, according to an exemplary embodiment of the present application, a UV-cut film can be comprised on a first transparent adhesive layer, thereby planarizing a structure comprising the first transparent adhesive layer, and accordingly, it is possible to secure appearance characteristics of a transparent light emitting device display.

The invention claimed is:

1. A transparent light emitting device display comprising:
   a transparent substrate;
   a conductive metal pattern provided on the transparent substrate;
   a light emitting device provided on at least a part of the conductive metal pattern;
   a first transparent adhesive layer provided on the transparent substrate, the conductive metal pattern, and the light emitting device;
   a UV-cut film provided on the first transparent adhesive layer; and
   a second transparent adhesive layer provided on the UV-cut film,
   wherein the transparent light emitting device display further comprises a bonding layer between the transparent substrate and the conductive metal pattern, or
   the transparent light emitting device display further comprises a bonding layer on the transparent substrate and the conductive metal pattern is embedded in the bonding layer.

2. The transparent light emitting device display of claim 1, wherein the UV-cut film has a transmittance of 85% or more in a visible light region (380 nm≤λ≤780 nm), and a transmittance of less than 1% in a UV region (λ<380 nm).

3. The transparent light emitting device display of claim 1, wherein the UV-cut film is a transparent film comprising a UV absorber.

4. The transparent light emitting device display of claim 1, wherein the UV-cut film comprises: a transparent film; and a UV-cut coating layer provided on the transparent film.

5. The transparent light emitting device display of claim 1, wherein when the transparent light emitting device display further comprises the bonding layer on the transparent substrate and the conductive metal pattern is embedded in the bonding layer, at least a part of the conductive metal pattern embedded in the bonding layer is positioned such that the part of the conductive metal pattern is brought into contact with the light emitting device.

6. The transparent light emitting device display of claim 1, wherein the bonding layer comprises a thermosetting bonding agent composition, a UV curable bonding agent composition, or a cured product thereof.

7. The transparent light emitting device display of claim 1, wherein the conductive metal pattern comprises a wiring electrode part pattern and a light emitting device mounting part pattern, and
   the light emitting device is provided on the light emitting device mounting part pattern.

8. The transparent light emitting device display of claim 7, wherein the wiring electrode part pattern has a line width of 50 μm or less, and
   the light emitting device mounting part pattern has a line width of 100 μm or more.

9. The transparent light emitting device display of claim 1, wherein the conductive metal pattern comprises gold, silver, aluminum, copper, neodymium, molybdenum, nickel, or an alloy thereof.

10. The transparent light emitting device display of claim 1, wherein the conductive metal pattern has a thickness of 3 μm to 20 μm.

11. The transparent light emitting device display of claim 1, wherein each of the first transparent adhesive layer and the second transparent adhesive layer independently comprises one or more of a silicone-based material, an acrylic-based material, a urethane-based material, and a derivative thereof.

* * * * *